Dec. 20, 1966 E. COHEN 3,293,586

HALL PLATE DEVICES

Filed March 20, 1963

United States Patent Office 3,293,586

Patented Dec. 20, 1966

3,293,586

HALL PLATE DEVICES

Emanuel Cohen, Prestwich, England, assignor to Associated Electrical Industries Limited, London, England, a British company Filed Mar. 20, 1963, Ser. No. 266,743
Claims priority, application Great Britain, Mar. 28, 1962, 11,915/62
7 Claims. (Cl. 338—32)

Figure 1:
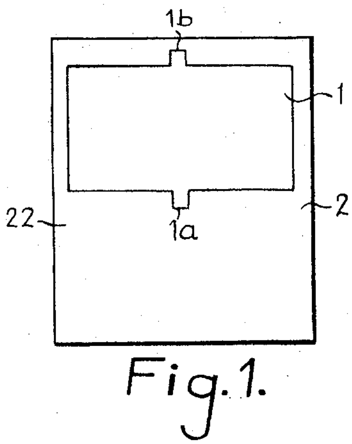

This invention relates to Hall plate devices, that is devices having a thin plate of semi-conductor material exhibiting the well known Hall effect and intended for use in such manner as to utilise this effect. In particular the invention concerns an improved means of applying low resistance ohmic contacts to a semi-conductor Hall plate.

A Hall plate may be required to be very thin, for example only 0.002″, or less, in order to obtain high sensitivity and a reasonable impedance. In the manufacture of a Hall plate device, a plate of suitable semi-conductor material which is fairly thick initially may be secured as by an adhesive on to a sheet of thin insulating material which constitutes a backing affording mechanical protection, and then subsequently reduced in thickness by conventional techniques to the required dimension of, say, 0.002″ approximately. A Hall plate less than 0.002″ thick may be formed by deposition of the semi-conductor material by evaporation on to the protective backing. The thickness of the protective backing may be of the order of 0.010″, so that with suitable low resistance ohmic contacts attached to the Hall plate and connecting wires soldered to these contacts to complete the device, the overall thickness of the device is still sufficiently small to enable it to be used, for instance, to explore magnetic fields in relatively narrow gaps by insertion therein.

Methods which are used for applying low resistance ohmic contacts to a Hall plate, when the latter is of a semi-conductor material such as silicon and germanium, are copper electroplating, nickel plating (electroless), and metallic vacuum evaporation: for Hall plates made of a high conductivity intermetallic semi-conductor material such as indium arsenide and indium antimonide, usually only the first of these methods, copper electroplating, is used. The method in each instance is followed by tinning and soldering of connecting wires to the ohmic contacts.

However, especially where the Hall plate is made of an intermetallic semi-conductor material as mentioned, the attachment thereto of the ohmic contacts and associated wiring connections can give rise to certain drawbacks. For instance, soldering of the connecting wires on to the contacts increases the overall thickness of the Hall plate device because of the inevitable solder fillet deposited at the solder connection. This limits the use of the device since the narrowest gap that it can investigate is governed, as aforesaid, by its overall thickness. Also, in applying a soldering iron to make the solder connection swiftness of operation is important, for if the iron has to be applied to a contact too often, or for too long a period, the mechanical strength of the contact may become poor and, moreover, an underlying adhesive by which the Hall plate is stuck to the insulating protective backing may tend to "bubble" or "curl up." This latter effect could lead to a fracture in the Hall plate in the vicinity of the contact.

With a view to overcoming these drawbacks the present invention provides a Hall plate device comprising a Hall plate on a sheet of mechanically protective insulating material with an appreciable area of the sheet left uncovered by the plate, together with ohmic contacts for the plate comprising respective mutually isolated strips of conductive material in electrical contact with the plate and extending therefrom on to said uncovered area of the sheet to a significant extent.

By providing conductive strips as the ohmic contacts for the Hall plate of a Hall plate device in this manner, connecting wires can be soldered to these strips at positions sufficiently remote from the plate to avoid any possible damage thereof due to a soldering action. Also, the actual solder connections no longer contribute to the overall thickness of the effective portion of the Hall plate device (that is the portion comprising the Hall plate and that area of the sheet of insulating material which serves as a protective backing for the plate), so that if the conductive strips all extend on to an uncovered area of the sheet lying between the Hall plate and one edge of the sheet there will be solder connections only adjacent that edge and therefore the effective portion of the device can be inserted, opposite edge of the sheet first, into a narrower gap than would otherwise be possible if the thickness of solder adjacent that opposite edge had to be taken into account.

More specifically, a Hall plate device according to the invention may comprise a Hall plate on a sheet of mechanically protective insulating material with an appreciable area of the sheet left uncovered by the plate at one side of the latter, current input ohmic contacts for the plate comprising two strips of conductive material in electrical contact with the plate at opposite ends thereof and extending on to said uncovered area of the sheet to a significant extent, a first output voltage ohmic contact constituted by a further strip of conductive material in electrical contact with the plate at an intermediate position along its said side and extending on to said uncovered area of the sheet, a film of insulating material overlying said further strip and extending across the plate with a small area of the plate left exposed at its opposite side, and a second output voltage ohmic contact constituted by another strip of conductive material in electrical contact with said small area of the plate and extending over said film and on to the uncovered area of the sheet, all said strips being electrically isolated from each other.

The overlying disposition of the conductive strips constituting the voltage output ohmic contacts provides a loop effect analogous to the loop which the output leads of a Hall plate are sometimes arranged to form in order to reduce to a minimum, unwanted E.M.F.'s induced into the output leads. Such unwanted E.M.F.'s occur for instance where a magnetic field to which the Hall plate is subjected, is alternating, that is time dependent, the induced voltage being proportional to $dB/dt$, where B represents the field strength and $t$ represents the periodicity of the alternating magnetic field. For maximum effect the loop is required to be exactly at the middle of the Hall plate. This is difficult to accomplish with the usual Hall plate output leads, but with the present invention accurate central positioning of the voltage output ohmic contact strips can be achieved.

Figure 5:
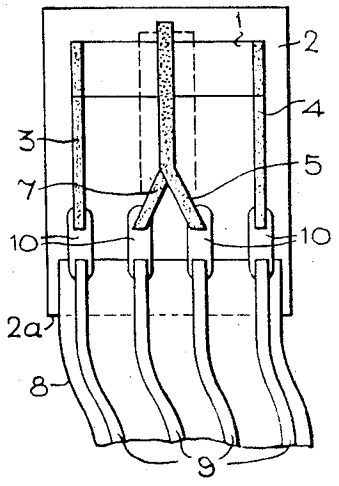

In order that the invention may be more fully understood reference will now be made by way of example to the accompanying drawing in which:

FIGS. 1–4 illustrate diagrammatically various stages in the manufacture of a Hall plate device provided with ohmic contacts in conformity with the invention, and FIG. 5 illustrates a way of making printed circuit connections to the ohmic contacts.

Figure 2:
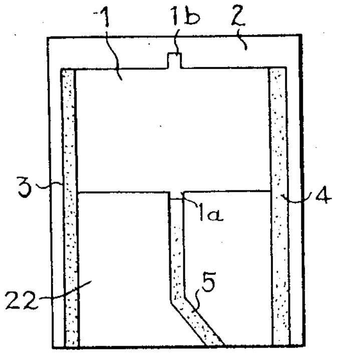

Referring to FIG. 1, a Hall plate 1 of a suitable semi-conductor material such as indium arsenide is secured as by an adhesive to an insulating ceramic backing sheet 2 affording mechanical protection for the plate 1. The plate 1, which is assumed to have a required thickness of, say, approximately 0.002" produced by conventional techniques, is eccentrically positioned on the backing sheet 2 so as to leave a substantial area 22 uncovered at one side of the plate. As shown in FIG. 2, the next stage in the manufacture is to form on the plate 1 and on the backing sheet 2 conductive strips 3, 4 and 5 which are of a good conductive material such as silver or gold. These strips 3, 4 and 5 are conveniently formed by covering the plate 1 and sheet 2 with a mask in which are provided slits at the positions where the strips are to be formed, and then by means of a vacuum evaporation or other suitable process depositing through the slits on to the plate 1 and sheet 2 the conductive material forming the strips. The conductive strips 3 and 4, which are in electrical contact with the plate 1 at opposite ends thereof, serve as current input ohmic contacts, while the strip 5, which is in electrical contact with a centrally positioned offset side portion 1*a* of the plate 1 serves as an output voltage ohmic contact.

Figure 3:
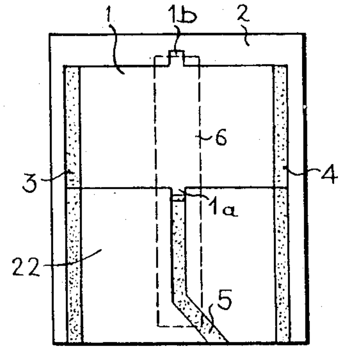

The next stage in the manufacture is illustrated in FIG. 3. The first mask is removed and a second mask with a single slit is now placed over the plate 1 and sheet 2. An insulating film 6 is formed over a central portion of the plate 1, so as to overlie the conductive strip 5, by applying through the slit in the second mask a fine spray of insulating material: this may be a quick drying insulating fluid.

Figure 4:
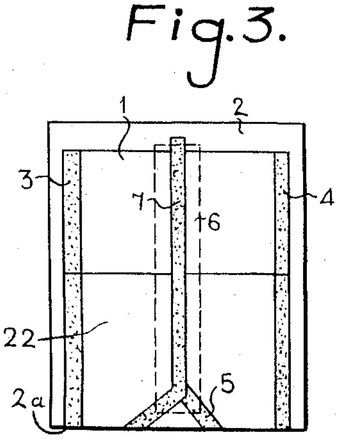

The second mask is then removed and a third and final mask is now placed over the plate 1 and sheet 2 in order to deposit on the insulating film 6, as shown in FIG. 4, a further conductive strip 7 which is in electrical contact with a centrally positioned offset portion 1*b* of the plate 1, left exposed by the film 6. In order to provide a loop effect as mentioned previously, this latter strip 7, which serves as a second voltage output ohmic contact, is positioned as nearly as possible at the centre of the plate 1. The precision with which this can be achieved is governed by the accuracy with which the slits in the various masks can be positioned.

There is thus obtained, as illustrated in FIG. 4, a Hall plate device comprising the Hall plate 1 on the insulating sheet 2 with conductive strips 3, 4, 5 and 7 contacting the plate 1 at the positions previously mentioned and extending on to the area 22 of the sheet 2, the strips 5 and 7 being insulated from each other by the insulating film 6 between.

The conductive strips 3, 4, 5 and 7 extend on to and over the uncovered area 22 of the sheet 2 to its edge 2*a* (FIG. 4), where connecting wires can be soldered to them without any risk of damaging the Hall plate 1. The conductive strips may then, if desired, be covered with a protective coating of insulating material such as an epoxy resin.

Although connecting wires can be soldered to the conductive strips without risk of damage to the Hall plate, soldering as the method of connection may nevertheless be unsatisfactory in that it could lead to damage of the conductive strip, particularly when a high thermal conductivity substrate (insulating sheet 2) is used for the Hall plate device. For a satisfactory solder connection, care must be taken to apply the correct amount of solder, the soldering iron has to be at the correct temperature, and the time required for the application of heat has to be estimated accurately. It is easy to melt or burn away a contact portion of a conductive strip, and even when a satisfactory contact is made a solder fillet remains. Also, oxide, sulphide, and aqueous films may form on the conductive strips soon after they are formed, making a good solder joint difficult to attain.

Ultrasonic welding has advantages which make it attractive as an alternative method of joining connecting wires to the conductive strips. The bond created between ultrasonically welded parts is a true solid state metallurgical bond and does not require melting of the base materials. The mechanical motion imparted by an ultrasonic transducer creates the conditions necessary for the weld, and if an impurity film is present on either of the parts to be welded the ultrasonic energy produces compression and shear stresses which rupture the film and expose a clean surface, the unsatisfied bonding atoms of which link to form a metallurgical bond. Ultrasonically welded connections have low noise characteristics and are essentially ohmic—even in joints of dissimilar metals—because the low temperature of the operation greatly reduces the formation of brittle, high resistance intermetallic compounds. An additional advantage of the low temperature of the operation is that there is no danger of thermal distortion.

Experiment has shown that it is difficult to obtain a satisfactory weld between a deposited conductive strip and a connecting wire due principally to the small area of contact. To overcome this difficulty there is employed in the present instance a method of ultrasonic welding in which a thin disc of a ductile and malleable material, which is a good electrical conductor, is interposed between the conductive strip and the connecting wire. It has been found that such a disc, which is suitably of indium, spreads under the influence of ultrasonic energy over a large surface area of the strip and wire and a weld is achieved between the wire, the disc and the conductive strip over a relatively large area. The contact resistance of the weld is small.

Another method of making connection to the conductive strips is by means of printed wiring connections as illustrated in FIG. 5. For this method the conductive strips 3, 4, 5 and 7 may terminate short of the edge 2*a* of the sheet 2 and a strip of thin, preferably flexible, printed wiring 8 having four printed conductors 9 is secured, as by means of a thermosetting adhesive, to the portion of the sheet 2 between its edge 2*a* and the ends of the conductive strips 3, 4, 5 and 7. An individual electrical connection between each conductive strip and a printed conductor is then effected by means of a conducting compound 10, such as silver paint, which is painted or otherwise deposited on the sheet 2 between, and in contact with, the conductive strip and printed conductor. This latter method of connection, which is simple and quick, preserves the laminar structure of the device. Furthermore, the printed conductors cannot become tangled together as might individual connecting wires.

What I claim is:

1. The manufacture of a Hall plate device by providing a plate of semi-conductor Hall effect material on a sheet of mechanically protective insulating material with an area of the sheet left uncovered by the plate at one side of the latter, subsequently forming current input ohmic contacts on the plate by deposition of conductive material in electrical contact with the plate at opposite ends thereof, said material extending as respective strips from said opposite ends of the plate on to said uncovered area of the sheet, similarly depositing as a first output voltage ohmic contact for said plate further conductive material in electrical contact with the plate at an intermediate position along its said side and extending as a further strip on to said uncovered area of the sheet, applying over said further strip a film of insulating material extending across the plate with a small area thereof left exposed at its opposite side, and similarly depositing as a second voltage output ohmic contact for the plate of conductive material in electrical contact with said small area of the plate and extending as a strip over said film of insulating material and on to said uncovered area of the sheet, all said conductive strips being electrically isolated from each other and extending on to said uncovered area sufficient for external connection to be made to the strips at a position removed from the Hall plate.

2. The manufacture of a Hall plate device as claimed in claim 1, wherein for the deposition of the conductive strips constituting the current input ohmic contacts and the further strip constituting said first voltage output ohmic contact, the plate and sheet are covered with a first mask having slits through which conductive material forming these strips is deposited on to the plate and sheet, and wherein for the application of said insulating film and the deposition of the remaining conductive strip, the first mask is replaced by a second mask having a slit through which insulating material is sprayed to form said insulating film, and the second mask is thereafter replaced by a third mask having a slit through which conductive material forming said remaining strip is deposited, the slits in said masks being shaped and positioned according to the required shapes and positions of the strips to be formed through them.

3. The manufacture of a Hall plate device as claimed in claim 2 including the step of welding a connecting wire to each conductive strip by a method of ultrasonic welding in which a thin disc of a ductile and malleable material, which is a good electrical conductor, is interposed between the conductive strip and the connecting wire.

4. The manufacture claimed in claim 3 using a thin disc of indium for the ultrasonic welding.

5. The manufacture of a Hall plate device as claimed in claim 1 including securing a strip of printed wiring containing a printed conductor in respect of each conductive strip to said uncovered area of the sheet and effecting an individual electrical connection between each conductive strip and the appertaining printed conductor by depositing a conducting compound on the sheet in contact with the strip and conductor.

6. A Hall plate device comprising a Hall plate of semiconductor Hall effect material on a sheet of mechanically protecting insulating material with an area of the sheet left uncovered by the plate at one side of the latter, current input ohmic contacts for the plate comprising two deposited strips of conductive material in electrical contact with and connected directly to the plate at opposite ends thereof, said strips extending continuously from the point of connection with the plate to said uncovered area of the sheet, a first output voltage ohmic contact constituted by a further strip of deposited conductive material in electrical contact with and connected directly to the plate at an intermediate position along its said side and extending continuously from the point of connection with the plate to said uncovered area of the sheet, a film of insulating material overlying said further strip and extending across the plate with a small area of the plate left exposed at its opposite side, and a second output voltage ohmic contact constituted by another strip of deposited conductive material in electrical contact with and connected directly to said small area of the plate superimposed above said further strip and extending continuously from the point of connection with the plate over said film and on to the uncovered area of the sheet, all said strips being electrically isolated from each other and extending on to said uncovered area sufficient for external connection to be made at positions removed from the Hall plate.

7. A Hall plate device as claimed in claim 6, having secured to said uncovered area of said sheet a strip of printed wiring containing a printed conductor in respect of each conductive strip, each printed conductor having an individual electrical connection between it and the appertaining conductive strip.

References Cited by the Examiner

UNITED STATES PATENTS

| | | | |
|---|---|---|---|
| 2,914,728 | 11/1959 | Brophy et al. | 324—45 |
| 2,966,647 | 12/1960 | Lentz | 338—32 |
| 2,983,889 | 5/1961 | Green | 338—32 |
| 3,016,507 | 1/1962 | Grant et al. | 338—32 |
| 3,042,887 | 7/1962 | Kuhrt et al. | 338—32 |
| 3,052,823 | 9/1962 | Anderson et al. | 174—68.5 X |
| 3,059,196 | 10/1962 | Lentz | 338—32 |
| 3,061,911 | 11/1962 | Baker | 29—155.5 |
| 3,073,011 | 1/1963 | Boyd et al. | 29—155.5 |
| 3,105,869 | 10/1963 | Branch et al. | 174—68.5 |
| 3,139,600 | 6/1964 | Rasmanis et al. | 307—88.5 X |
| 3,143,714 | 8/1964 | Evans et al. | 307—88.5 X |
| 3,199,002 | 8/1965 | Martin | 29—155.5 |
| 3,207,838 | 9/1965 | McCormick | 174—68.5 |

OTHER REFERENCES

Dummer, Electronics, Jan. 1, 1960, pp. 71–75.

RICHARD M. WOOD, *Primary Examiner.*

H. T. POWELL, W. D. BROOKS, *Assistant Examiners.*